(12) United States Patent
Weed et al.

(10) Patent No.: US 11,221,184 B1
(45) Date of Patent: Jan. 11, 2022

(54) CARBON NANOTUBE HEAT PIPE OR THERMOSIPHON

(71) Applicant: Ball Aerospace & Technologies Corp., Boulder, CO (US)

(72) Inventors: Kevin Weed, Superior, CO (US); Jeremy Harvey, Boulder, CO (US); Bevan D. Staple, Longmont, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 111 days.

(21) Appl. No.: 16/704,778

(22) Filed: Dec. 5, 2019

Related U.S. Application Data

(60) Provisional application No. 62/775,654, filed on Dec. 5, 2018.

(51) Int. Cl.
| | |
|---|---|
| *B23P 15/26* | (2006.01) |
| *F28D 15/04* | (2006.01) |
| *C23C 16/26* | (2006.01) |
| *H05K 7/20* | (2006.01) |
| *H01Q 1/02* | (2006.01) |

(52) U.S. Cl.
CPC ............ *F28D 15/046* (2013.01); *B23P 15/26* (2013.01); *C23C 16/26* (2013.01); *H05K 7/20245* (2013.01); *H01Q 1/02* (2013.01)

(58) Field of Classification Search
CPC ........ F28D 15/046; C23C 16/26; B23P 15/26; H05K 7/20245; B21D 53/02; B21C 37/22
See application file for complete search history.

(56) References Cited

U.S. PATENT DOCUMENTS

| | | | |
|---|---|---|---|
| 5,602,389 A | 2/1997 | Kato et al. | |
| 5,608,838 A | 3/1997 | Brookley | |
| 5,822,222 A | 10/1998 | Kaplinsky et al. | |
| 7,001,068 B2 | 2/2006 | Howard | |
| 7,068,366 B2 | 6/2006 | Burk | |
| 8,101,905 B2 | 1/2012 | Rogers | |
| 8,555,689 B2 * | 10/2013 | Hollinger | C10M 145/26 72/274 |
| 8,556,501 B2 | 10/2013 | Topham et al. | |
| 8,569,701 B2 | 10/2013 | Reda | |

(Continued)

OTHER PUBLICATIONS

Emery et al. "Estimating Sea Surface Temperature From Infrared Satellite and In Situ Temperature Data," Bulletin of the American Meteorological Society, Dec. 2001, vol. 82, No. 12, pp. 2773-2786.

(Continued)

*Primary Examiner* — Lawrence Averick
(74) *Attorney, Agent, or Firm* — Sheridan Ross P.C.

(57) ABSTRACT

Heat transfer systems and methods are provided. The heat transfer system includes an evaporator section integrated with or thermally joined to a heat dissipating system. The evaporator section is connected to a condenser section by a conduit. Together, portions of the evaporator section, the condenser section, and the conduit form a closed volume containing a heat transfer fluid. A superhydrophobic surface is present on at least a portion of the condenser section forming a part of the closed volume. The superhydrophobic surface can include a plurality of carbon nanotubes. The carbon nanotubes can be provided as a forest of carbon nanotubes extending from a rough surface.

18 Claims, 6 Drawing Sheets

(56) References Cited

U.S. PATENT DOCUMENTS

| | | | |
|---|---|---|---|
| 8,657,487 B2 | 2/2014 | Bingham et al. | |
| 8,716,054 B2* | 5/2014 | Jeong | H01L 27/1462 |
| | | | 438/69 |
| 8,748,808 B2 | 6/2014 | Le Noc et al. | |
| 8,895,997 B2 | 11/2014 | Maki et al. | |
| 9,086,327 B2 | 7/2015 | Chow et al. | |
| 9,182,298 B2 | 11/2015 | Yagoubov | |
| 9,212,968 B1 | 12/2015 | Smith et al. | |
| 9,425,254 B1 | 8/2016 | Gross et al. | |
| 9,909,814 B2* | 3/2018 | Yang | B23P 15/26 |
| 10,307,583 B2* | 6/2019 | Williams | A61M 39/10 |
| 10,386,241 B1 | 8/2019 | Staple et al. | |
| 11,054,189 B2* | 7/2021 | Salim Shirazy | F28F 21/062 |
| 2007/0151703 A1* | 7/2007 | Touzov | A41D 13/0051 |
| | | | 165/45 |
| 2008/0036356 A1 | 2/2008 | Ward et al. | |
| 2009/0053636 A1* | 2/2009 | Lin | G03G 5/142 |
| | | | 430/58.5 |
| 2010/0006761 A1 | 1/2010 | Johnson et al. | |
| 2010/0170624 A1* | 7/2010 | Hollinger | C10M 145/38 |
| | | | 156/117 |
| 2011/0168256 A1 | 7/2011 | Wang et al. | |
| 2012/0201630 A1* | 8/2012 | Klenk | B21D 51/26 |
| | | | 413/1 |
| 2013/0180593 A1* | 7/2013 | Gupta | F28D 15/046 |
| | | | 137/2 |
| 2013/0307039 A1* | 11/2013 | Jeong | H01L 27/1462 |
| | | | 257/292 |
| 2015/0142364 A1 | 5/2015 | Workman | |
| 2016/0187070 A1* | 6/2016 | Yang | F28D 15/0241 |
| | | | 165/104.26 |
| 2016/0243348 A1* | 8/2016 | Williams | A61M 39/165 |
| 2017/0089759 A1 | 3/2017 | Fleck | |
| 2017/0108383 A1 | 4/2017 | Chow et al. | |
| 2018/0180981 A1 | 6/2018 | Crawford et al. | |
| 2018/0320985 A1* | 11/2018 | Salim Shirazy | F28D 15/046 |
| 2019/0345358 A1* | 11/2019 | De Coninck | C09D 7/67 |
| 2020/0370840 A1* | 11/2020 | Li | F28D 15/043 |

OTHER PUBLICATIONS

Mizuno et al. "A black body absorber from vertically aligned single-walled carbon nanotubes," PNAS, Apr. 2009, vol. 106, No. 15, pp. 6044-6047.

* cited by examiner

VACNTs 176°

VACNT SURFACE MORPHOLOGY ON ROUGH SiC

EXPANDED VIEW OF VACNT ON SiC GRAINS

CARBON NANOTUBE HEAT PIPE OR THERMOSIPHON

CROSS-REFERENCE TO RELATED APPLICATIONS

This application claims the benefit of U.S. Provisional Patent Application Ser. No. 62/775,654, filed Dec. 5, 2018, the entire disclosure of which is hereby incorporated herein by reference.

FIELD

Heat transfer systems and methods incorporating condenser surfaces formed from carbon nanotubes are provided.

BACKGROUND

The ever-increasing density and complexities of the electronic and RF components in large Multi Input Multi Output (MIMO) antenna arrays associated with fifth generation (5G) wireless communication systems require novel thermal management solutions to ensure adequate cooling. Conventional cooling approaches include heat pipes and thermosiphons which operate using a working fluid under natural convection. That is, the heated liquid is evaporated at one end due to electronics heating and the vapor then releases the heat at the condenser end, which is in contact with the heat sink fins, by changing its phase back to liquid.

SUMMARY

Heat transfer systems and methods in accordance with embodiments of the present disclosure provide high efficiency and reliability, and the ability to be closely integrated with electronic or other heat dissipating components for which cooling is required or desirable. A heat transfer system or method as disclosed herein generally includes heating a fluid in an evaporator section, and cooling the fluid in a condenser section having a superhydrophobic surface formed from a forest of carbon nanotubes. In at least some embodiments of the present disclosure the evaporator and condenser sections are joined by an adiabatic section in which vapor flows upwards from the evaporator section to the condenser section through a center portion of the adiabatic section, and in which liquid flows downwards from the condenser section through outer portions of the adiabatic section. In accordance with other embodiments of the present disclosure an output end of the evaporator section is joined to an input end the condenser section by a first or vapor conduit, and an output end of the condenser section is joined to an input end of the evaporator section by a second or liquid conduit.

In accordance with embodiments of the present disclosure, a heat transfer system includes an evaporator joined to a condenser by a container or conduit. Interior surfaces of the evaporator, the condenser, and the conduit define a sealed volume containing a heat transfer fluid. The heat transfer fluid can include a thermally conductive material, such as water, ammonia, or other fluid. At least a portion of the interior surface of the condenser is superhydrophobic. Moreover, the superhydrophobic surface of the condenser is formed from carbon nanotubes (CNTs). In at least some embodiments of the present disclosure, a portion of the interior surface of the conduit is superhydrophobic. The interior surface of the evaporator is not hydrophobic. For example, the interior surface of the evaporator may be hydrophilic. The evaporator may be joined to or integral with cooling fins. The condenser may be joined to or integral with a system or component for which cooling is required or desired. For example, the evaporator of the heat transfer system can be integrated with an electronic circuit.

Methods in accordance with embodiments of the present disclosure include passing a heat transfer fluid over a surface of an evaporator that is joined to or integral with a heat dissipation component or system for which cooling is desired or required. The surface in contact with the heat transfer fluid may be hydrophilic. Heated heat transfer fluid is passed by a conduit to a condenser. Some or all of the surface of the condenser is superhydrophobic. The heat transfer fluid is then passed back to the evaporator through the same conduit used to pass the heated heat transfer fluid to the condenser, or through a second conduit. The method can include integrating the condenser with or joining the condenser to cooling fins.

Additional features and advantages of embodiments of the present disclosure will become more readily apparent from the following description, particularly when taken together with the accompanying drawings.

DETAILED DESCRIPTION

Figure 1A:
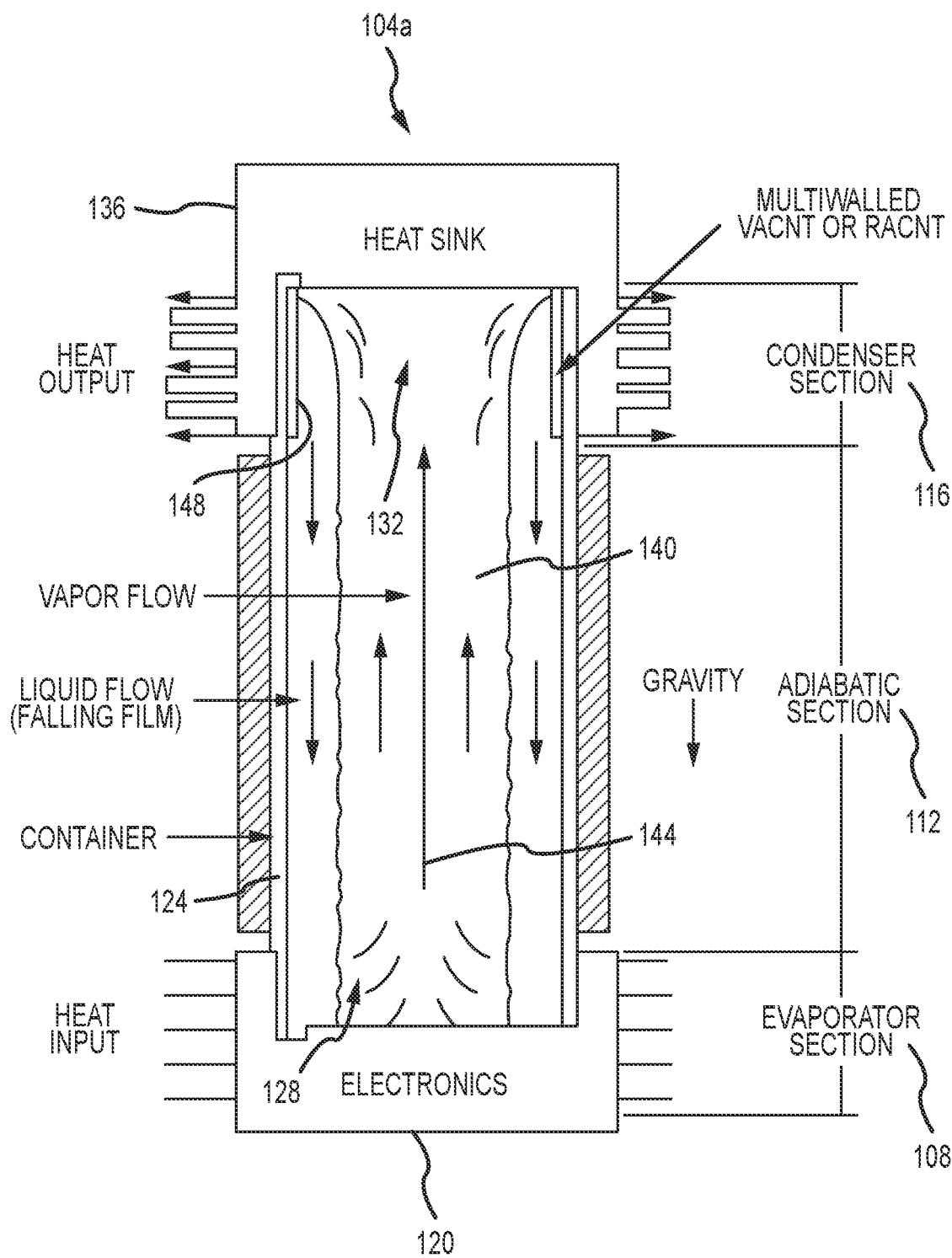
FIG. 1A depicts a heat transfer system in accordance with embodiments of the present disclosure in cross section.

FIG. 1A depicts a heat transfer system 104a in accordance with embodiments of the present disclosure in cross section. In this example, the heat transfer system 104a is configured as a thermosiphon. The heat transfer system 104a generally includes an evaporator or heat input section 108, a connecting or adiabatic section 112, and a condenser or heat output section 116. The evaporator section 108 is in thermal communication with a heat producing or dissipating component or system, such as but not limited to electronics 120. Moreover, the evaporator section 108 can be integrated with the electronics or portions of the electronics 120 associated with and cooled by the heat transfer system 104a. The adiabatic section 112 can be formed from a container or conduit 124, also referred to herein as a connecting section 124, having an open lower portion 128 and an open upper portion 132. The condenser section 116 can be integrated with a heat sink 136. The open lower portion 128 is sealed by the portion of the electronics 120 forming the evaporator section 108, and the open upper portion of the container 124 is sealed by the heat sink 136. Together, the container 124, the portion of the electronics 120 forming the evaporator section 108, and the heat sink 136 define a sealed volume 140. A heat transfer or conductive operating or working fluid 144 is contained within the sealed volume 140. In operation, the condenser section 116 is positioned above the evaporator section 108.

The heat transfer system 104a in accordance with embodiments of the present disclosure also includes a superhydrophobic surface or region 148. The superhydrophobic surface 148 is formed on at least some surfaces of the sealed volume 140 corresponding to the condenser section 116 of the heat transfer system 104. Accordingly, the superhydrophobic surface 148 may be located on at least some portions of the container 124 and/or the heat sink 136 surfaces within the condenser section 116 and defining portions of the sealed volume 140. In addition, the superhydrophobic surface 148 can extend to portions of the container 124 forming the adiabatic section 112. However, the superhydrophobic surface 148 is not formed in the evaporator section 108 of the heat transfer system 104. In accordance with further embodiments of the present disclosure, the superhydrophobic surface 148 is formed only on surfaces within the condenser section 116.

Figure 1B:
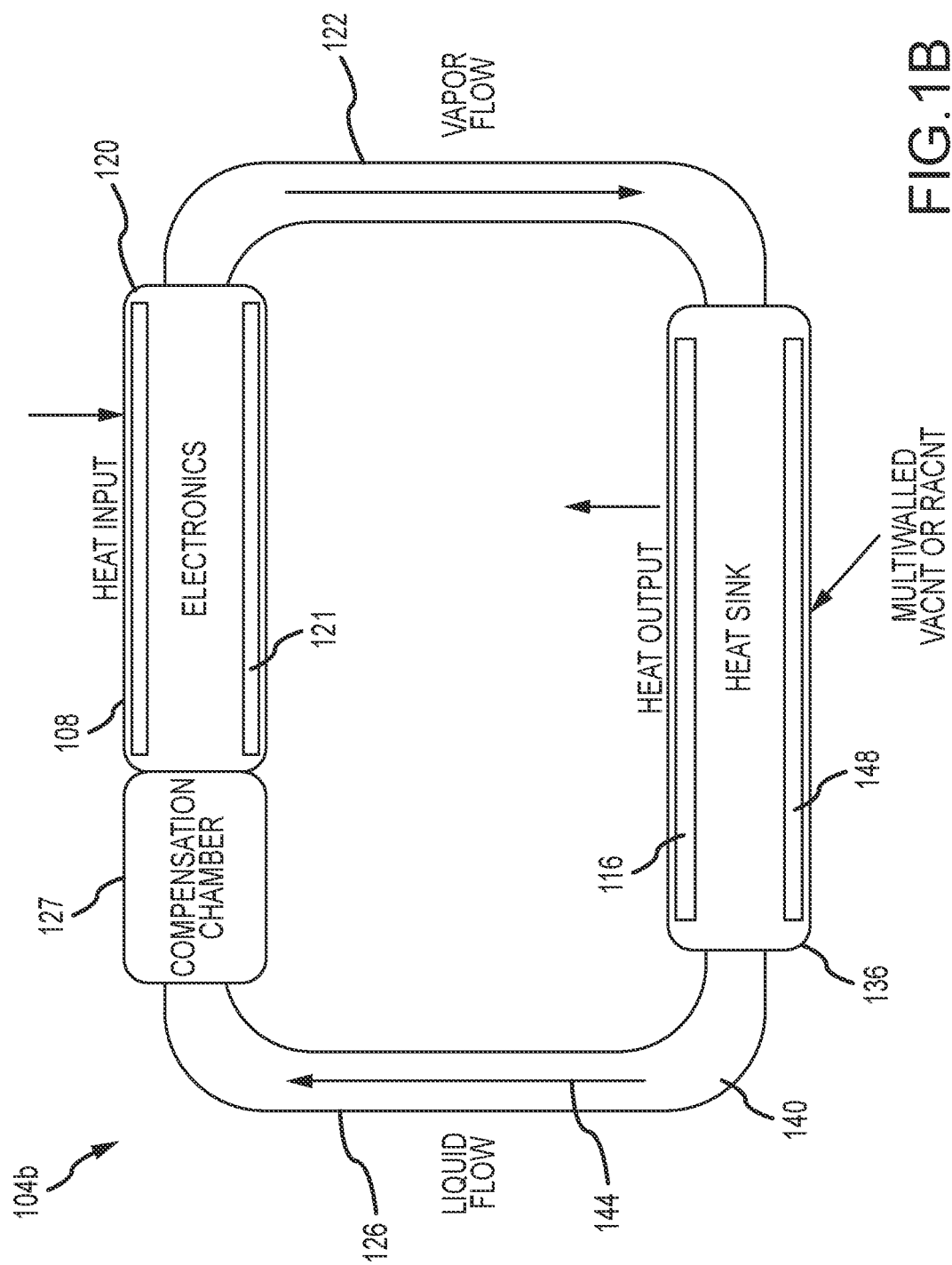
FIG. 1B depicts a heat transfer system in accordance with other embodiments of the present disclosure in cross section.

FIG. 1B depicts a heat transfer system 104b in accordance with other embodiments of the present disclosure in cross section. In this example, the heat transfer system 104b is configured as a loop heat pipe. The heat transfer system 104b generally includes an evaporator or heat input section 108 and a condenser or heat output section 116. The evaporator section 108 can be integrated with the electronics or portions of the electronics 120 associated with and cooled by the heat transfer system 104, and can include a wick structure 121. Alternatively or in addition, the evaporator section can be thermally joined to the electronics 120 or other heat producing component or system. An output end of the evaporator section 108 can be connected to an input end of the condenser section 116 by a first connecting or vapor conduit 122. An output end of the condenser section 116 can be connected to an input end of the evaporator section 108 by a second connecting or liquid conduit 126. In accordance with at least some embodiments of the present disclosure, a compensation chamber 127 may be provided between the liquid conduit 126 and the input end of the evaporator section 108. The condenser section 116 can be integrated with a heat sink 136. Together, the evaporator section 108, the vapor conduit 122, the condenser section 116, the liquid conduit 126, and, if provided, the compensation chamber 127, form a closed or sealed volume 140 in the form of a loop. A heat transfer or conductive operating fluid 144 is contained within the sealed volume 140. In accordance with at least some embodiments of the present disclosure, a wick structure 121 can be included within one or both of the vapor conduit 122 and the liquid conduit 126.

The heat transfer system 104b in accordance with embodiments of the present disclosure also includes a superhydrophobic surface or region 148. The superhydrophobic surface 148 is formed on at least some surfaces of the sealed volume 140 corresponding to the condenser section 116 of the heat transfer system 104. Accordingly, the superhydrophobic surface 148 may be located on at least some portions of the heat sink 136 surfaces within the condenser section 116 and defining a portion of the sealed volume 140. Although the superhydrophobic surface 148 can also extend to portions of the conduits 122 or 126, the superhydrophobic surface 148 is not formed in the evaporator section 108 of the heat transfer system 104. In accordance with further embodiments of the present disclosure, the superhydrophobic surface 148 is formed only on surfaces within the condenser section 116.

Figure 2:
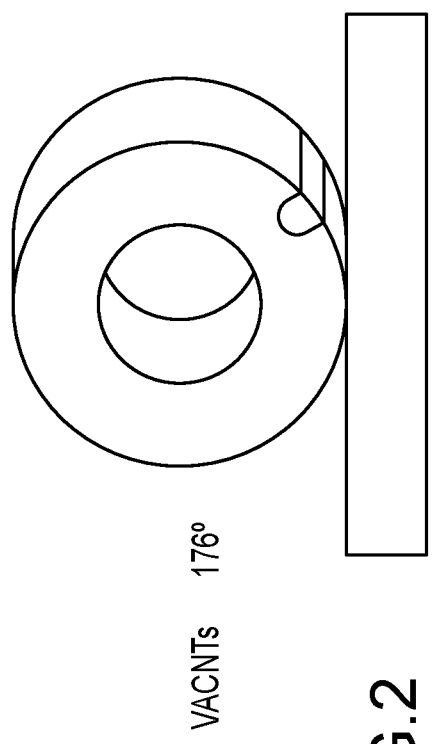
FIG. 2 depicts a detail of a liquid droplet on a vertically-aligned carbon nanotube layer.
Figure 3:
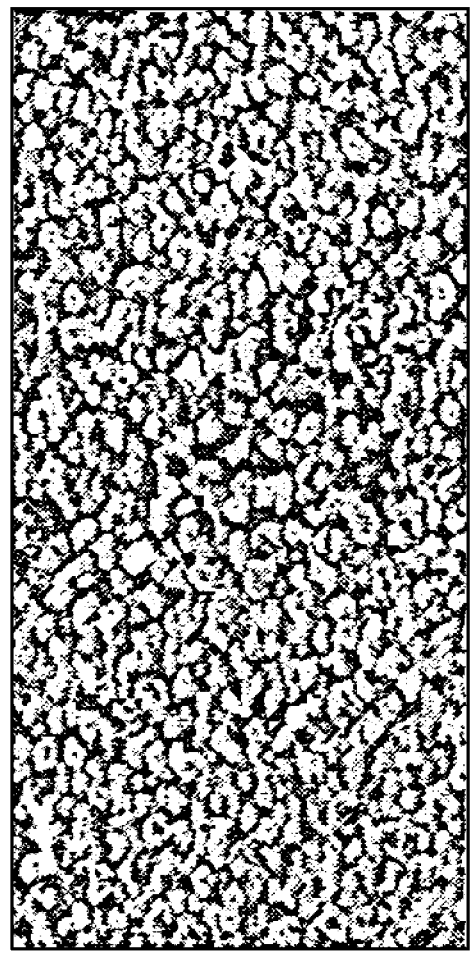
FIG. 3 depicts a detail of a surface composed of a forest of irregular, vertically-aligned carbon nanotubes.
Figure 4:
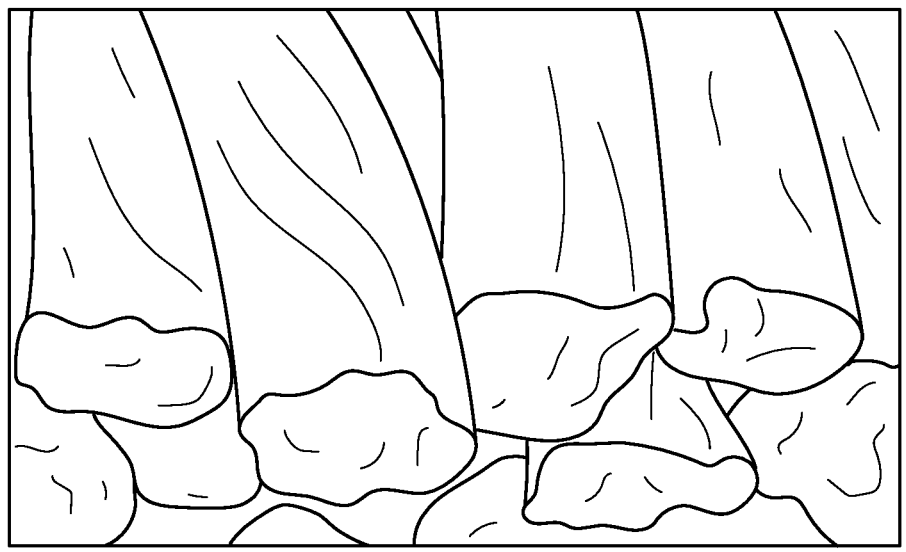
FIG. 4 depicts a detail of vertically-aligned carbon nanotubes anchored to a substrate having a rough surface.

As used herein, a superhydrophobic surface 148 is a surface having a water droplet contact angle of greater than or equal to 176° (see FIG. 2). In accordance with the least some embodiments of the present disclosure, the superhydrophobic surface 148 is provided as a multiwalled vertically aligned carbon nanotube (VACNT) layer formed on a substrate having a rough surface morphology (see FIGS. 3 and 4). Alternatively, the superhydrophobic surface 148 can be provided as a single walled VACNT. The VACNT layer includes a forest of carbon nanotubes extending from a rough surface or substrate. Because the VACNT is grown on a rough substrate and conforms to that substrate texture, the VACNT's forest is irregular (i.e. has a rough surface morphology). As examples, but without limitation, the carbon nanotubes may have a length of from about 150 μm to about 300 μm, a diameter of from about 30 nm to about 200 nm, and a spacing between adjacent carbon nanotubes of from about 0.4 μm to about 1.1 μm, and the surface roughness ratio of the substrate from which the CNTs are grown can be from about 1.0 to about 2.0, where about is +/−10%. The substrate can include a SiC material. The resulting surface is naturally superhydrophobic and very thermally conductive. In accordance with at least some embodiments of the present disclosure, the VACNT forest can be grown on the condenser section 116 of the heat pipe or thermosiphon using conventional chemical vapor deposition (CVD) growth manufacturing processes to provide a long-lasting, mechanically robust, wear-resistant surface having enhanced heat transfer performance. By growing and anchoring VACNT forest on a rough substrate, the wear resistance of the VACNT superhydrophobic surface 148 is increased. In addition, this helps maintain hierarchical roughness, thus increasing the longevity of the superhydrophobic surface 148.

Figure 7:
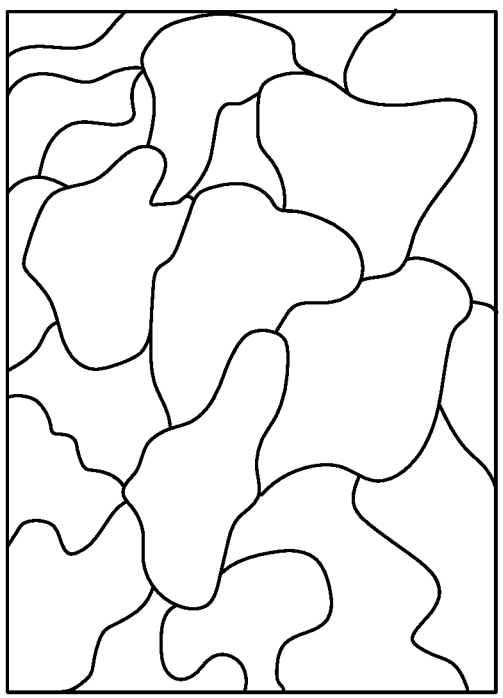
FIG. 7 depicts a detail of a surface coated with a superhydrophobic sprayable paint.
Figure 6:
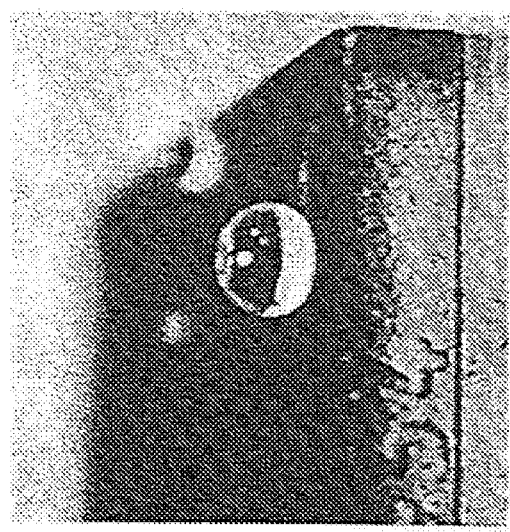
FIG. 6 depicts a surface coated with a superhydrophobic sprayable paint.

In accordance with further embodiments of the present disclosure, the superhydrophobic surface 148 is formed as an applied surface treatment. For example, the superhydrophobic surface 148 can be formed from a highly conductive, mechanically robust, superhydrophobic sprayable paint that includes randomly aligned carbon nanotubes (RACNT) and other organic materials dispersed in a carrier solution (FIG. 6). As the solution evaporates, it leaves behind a structured coating that is then functionalized and binds the coating structure together, forming the superhydrophobic surface 148 (FIG. 7). The surface formed by the RACNTs can exhibit a morphology that creates a long-lasting, superhydrophobic surface 148, that is resistant to flooding, thereby providing higher mobility compared to conventional systems.

A heat transfer fluid 144 can include any thermally conductive fluid. Examples of heat transfer fluids 144 include, but are not limited to, water, ammonia, alcohol, mercury, and sodium. In accordance with at least some embodiments, the heat transfer fluid 144 may be a low surface tension fluid, such as but not limited to liquid helium.

A wick structure 121, if included in the heat transfer system 104, can be a hydrophilic coating or structure configured to move the heat transfer fluid 144 along a surface of a heat transfer system 104 component through capillary action. For instance, a sparse carbon nanotube forest configured to separate liquid heat transfer fluid 144 from vaporized heat transfer fluid 144 can be used to provide a wick 121 structure, when the heat transfer fluid 144 is a low surface tension fluid. As another example, a wick structure 121 can be in the form of channels or grooves machined or formed in a surface of the heat transfer system 104 component.

Figure 8:
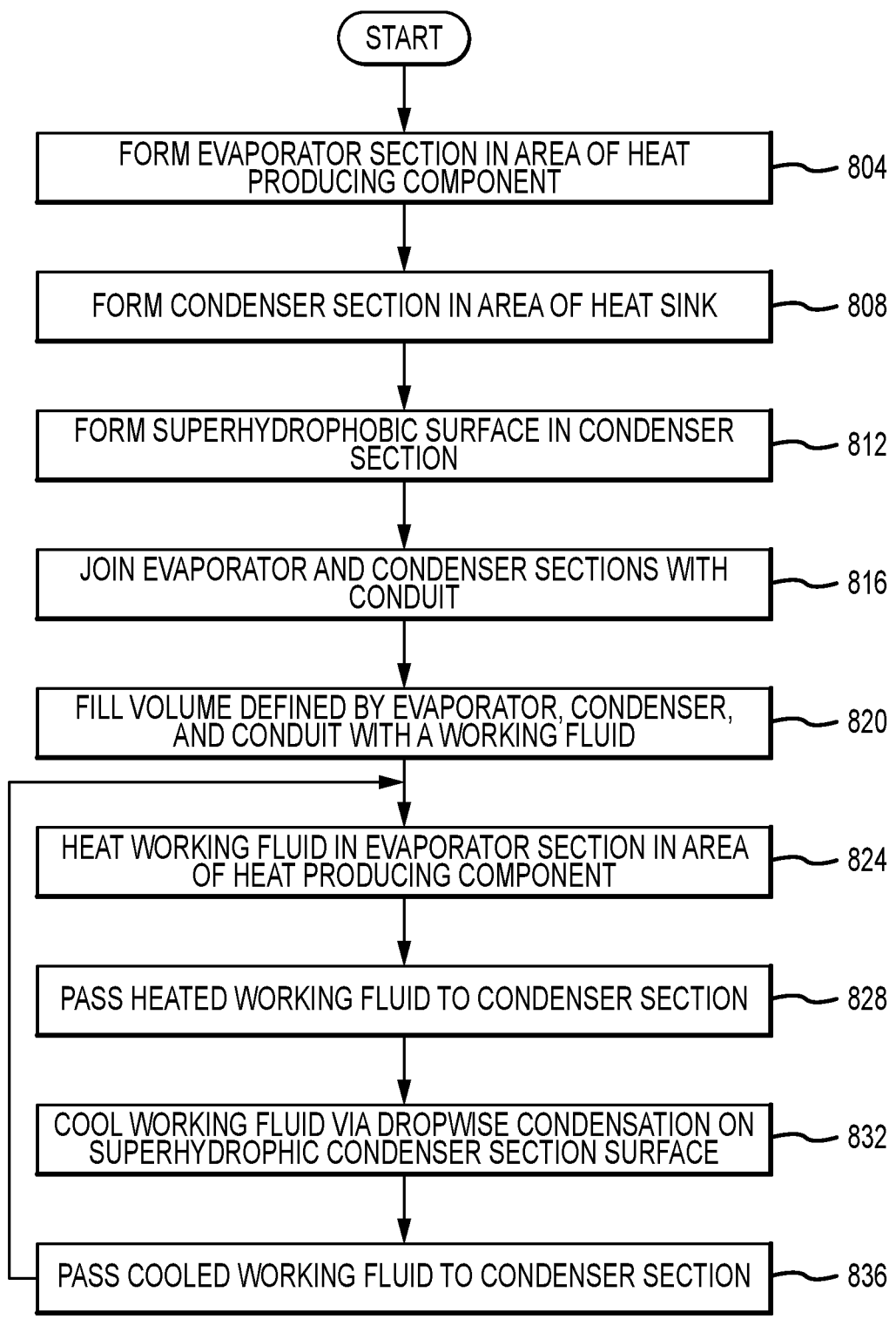
FIG. 8 is a flowchart illustrating aspects of a method for providing and operating a heat transfer system.

Aspects of methods for providing a heat transfer system 104 and for operating the heat transfer system 104 are depicted in FIG. 8. Initially, at step 804, the evaporator section 108 is formed in an area of a heat producing component. As examples, but without limitation, a heat producing component can include electronics 120, such as an integrated circuit, transistor, conductor, antenna element, resistor, circuit board, or any other component or set of components. Moreover, the evaporator section 108 can be integral to a structure supporting or incorporating a heat producing component. In accordance with the least some embodiments of the present disclosure, a surface of the evaporator section 108 in contact with the heat transfer fluid 144 can be provided with a wick structure 121.

At step 808, a condenser section 116 is formed in an area of a heat sink 136. As examples, but without limitation, a heat sink 136 can include a structure formed from a thermally conductive material. Moreover, the heat sink 136 can incorporate cooling fins, or can be configured as a radiator. At step 812, a superhydrophobic surface 148 is formed in the condenser section 116. The super hydrophobic surface 148 can be formed from a forest of vertically aligned carbon nanotubes that are grown on a rough surface. For example, the carbon nanotubes may be grown on a silicon substrate having a surface roughness with features having a peak to valley distance of about 20 μm. The forest of carbon nanotubes can be formed using chemical vapor deposition growth manufacturing processes.

At step 816, the evaporator 108 and condenser 116 sections are joined with a conduit or container. For example, when configured as a thermosiphon, the evaporator 108 and condenser 116 are joined by a container 124. When configured as a loop type heat pipe, an output of the evaporator section 108 is joined to an input of the condenser section 116 by a first conduit 122, and an output of the condenser section 116 is connected to an input of the evaporator section 108, either directly or via a compensation chamber 127, by a second conduit 126. In accordance with the least some embodiments of the present disclosure, the second conduit 126 can include a wick structure 121, to move the heat transfer fluid 144 from the condenser section 116 to the evaporator section 108, even where the condenser section 116 is not positioned below the evaporator section 108, or in zero gravity environments. The volume defined by the evaporator section 108, the container 124 or conduits 122 and 126, and the condenser section 116 is then filled with the working fluid 144, and the volume is sealed (step 820). The thus completed heat transfer system 104 is then ready for operation.

In operation, the working fluid 144 is heated in the evaporator section 108, and in particular by electronics 120 or other heat producing component in thermal communication with the evaporator section 108 (step 824). The heated working fluid 144 is passed to the condenser section 116 by the container 124 (when the heat transfer system 104 is configured as a thermosiphon type heat transfer system 104a) or by the first conduit 122 (when the heat transfer system 104 is configured as a loop heat pipe 104b) (step 828). The working fluid 144 is then cooled via drop wise condensation on the super hydrophobic 148 condenser section 116 surface (step 832). The cooled working fluid 144 is passed back to the evaporator section and 108 by the container (for a thermosiphon) or by the second conduit 126 (for a loop heat pipe)(step 836). As can be appreciated by one of skill in the art after consideration of the present disclosure, in a thermosiphon configuration, the condenser section 116 is positioned above the evaporator section 108. In a loop heat pipe configuration, the second conduit 126 can be provided with a wick structure 121, and/or the condenser section 116 can be located above the evaporator section 108. The operation of the heat transfer system 104 can continue for so long as heat is added to the heat transfer fluid 144 at the evaporator section 108.

More particularly, with reference again to FIG. 1A, during operation of the heat transfer system 104a, the operating fluid 144 is heated (vaporized) in the evaporator section 108. The resulting vapor travels upwardly, away from the evaporator section 108, through the adiabatic section 112, to the condenser section 116. In the condenser section 116, the operating fluid 144 is cooled. The resulting liquid falls back down the adiabatic section 112 to the evaporator section 108, and the operating fluid 144 is again heated and vaporized.

With reference again to FIG. 1B, during operation of the heat transfer system 104b, the operating fluid 144 is heated (vaporized) in the evaporator section 108. The resulting vapor travels away from the evaporator section 108, through the vapor conduit 122, to the condenser section 116. In the condenser section 116, the operating fluid 144 is cooled. The resulting liquid then flows through the liquid conduit 126 to the evaporator section 108, via the compensation chamber 127, and the operating fluid 144 is again heated and vaporized.

Figure 5:
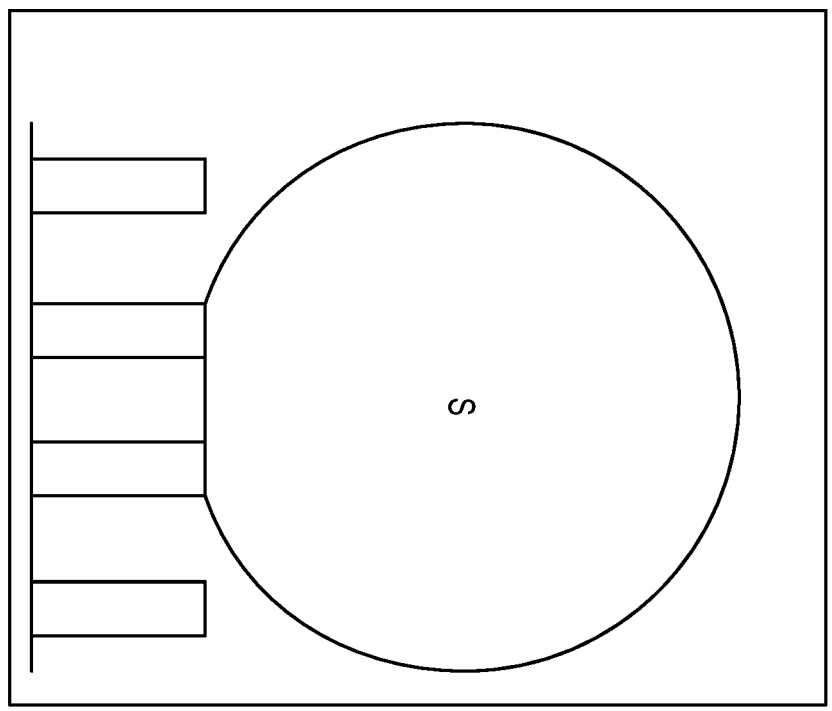
FIG. 5 depicts the low droplet adhesion of a vertically-aligned carbon nanotube surface structure.

As droplets of the vaporized operating fluid 144 contact the superhydrophobic surface 148 of the heat transfer system 104a or 104b, the heat in the droplets is removed. Accordingly, the operating fluid 144 undergoes dropwise condensation in the condenser section 116. Such dropwise condensation on the superhydrophobic surface 148 can enhance heat transfer by a factor of 2-3 compared to film condensation on conventional hydrophobic surface coatings and/or etched micro-surfaces. Moreover, this dropwise condensation of the operating fluid 144 that is promoted by the superhydrophobic surface 148 eliminates flooding of the superhydrophobic surface by maintaining low surface adhesion. As a result, the condensation heat transfer coefficient is increased. That is, because of the superhydrophobic surface, a liquid condensate-drop formed on that surface (see FIG. 5) has a higher mobility compared to conventional surfaces, and thus is rapidly removed to create the ideal conditions for continuous dropwise condensation. Moreover, because a flow of the operating fluid 144 through the CNT forest is not required, the operating lifetime and efficiency of the heat transfer system 104 is improved.

In accordance with at least some embodiments of the present disclosure, the superhydrophobic surface 148 can feature a self-cleaning aspect. For instance, in a heat transfer system 104a having a superhydrophobic surface 148 in an upper portion of a thermosiphon, above the portion where the heat transfer fluid 144 pools, the heat transfer fluid 144 will generally be in a vapor state in at least portions of the condenser section 116, and will gradually transition to a liquid state at or towards a lower portion of the condenser section 116. Accordingly a hydrophobic gradient will form, with vapor droplets undergoing dropwise condensation in at least the upper portion of the condenser section 116, where at least a portion of the superhydrophobic surface 148 is formed, and with the heat transfer fluid 144 transitioning to a liquid state lower down in the condenser section 116 and/or in the adiabatic section 112, where surface wetting may occur. As the liquid falls along the surface of at least the adiabatic section 116, and potentially at least portions of the superhydrophobic surface 148, the liquid can carry away impurities, thus producing a cleaning effect.

Embodiments of the present disclosure can be utilized to cool a variety of systems or instruments. For example, in at least some applications, a heat transfer system 104 as described herein can be integrated with the electronics of an antenna array, a remote radio head unit, or a base station included in a 5G communications system.

The foregoing discussion of the disclosed systems and methods has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described herein are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. A heat transfer system, comprising:
   an evaporator section;
   a connecting section;
   a condenser section, wherein surfaces of each of the evaporator section, the connecting section, and the condenser section form an enclosed volume, and wherein a superhydrophobic surface is present on at least a portion of the condenser section surface forming a part of the enclosed volume; and
   a heat transfer fluid, wherein the heat transfer fluid is contained within the enclosed volume, and wherein a superhydrophobic surface is not present on any portion of the evaporator section surface forming a part of the enclosed volume.

2. The heat transfer system of claim 1, wherein a superhydrophobic surface is not present on any portion of the connecting section surface forming a part of the enclosed volume.

3. The heat transfer system of claim 1, further comprising:
   a wicking structure on a portion of the surface of the evaporator section forming a part of the enclosed volume.

4. The heat transfer system of claim 1, wherein the superhydrophobic surface is mechanically robust.

5. The heat transfer system of claim 1, further comprising:
   a heat dissipating system, wherein the evaporator section is integrated with or thermally joined to the heat dissipating system.

6. The heat transfer system of claim 5, wherein the heat dissipating system is an electronic system.

7. The heat transfer system of claim 1, wherein the superhydrophobic surface includes a substrate and a forest of carbon nanotubes extending from a surface of the substrate.

8. The heat transfer system of claim 7, wherein the surface of the substrate is a rough surface.

9. The heat transfer system of claim 1, wherein the heat transfer system is configured as a loop heat pipe, and wherein the connecting section includes first and second conduits.

10. A heat transfer system, comprising:
    an evaporator section;
    a connecting section; and
    a condenser section, wherein surfaces of each of the evaporator section, the connecting section, and the condenser section form an enclosed volume, wherein superhydrophobic surface is present on at least a portion of the condenser section surface forming a part of the enclosed volume, and wherein the superhydrophobic surface includes a forest of vertically aligned carbon nanotubes.

11. The heat transfer system of claim 10, further comprising:
    a heat transfer fluid, wherein the heat transfer fluid is contained within the enclosed volume.

12. The heat transfer system of claim 10, wherein the forest of vertically aligned carbon nanotubes is formed on a substrate having a rough surface.

13. The heat transfer system of claim 12, wherein the substrate is a silicon substrate.

14. The heat transfer system of claim 12, wherein the rough surface of the substrate has a surface roughness ratio of from about 1.0 to about 2.0.

15. The heat transfer system of claim 12, wherein the superhydrophobic surface is present only on a portion of the condenser section.

16. The heat transfer system of claim 15, further comprising a wicking structure on a portion of the surface of the evaporator section forming a part of the enclosed volume, wherein the wicking structure includes a sparse forest of carbon nanotubes.

17. The heat transfer system of claim 16, further comprising:
    a heat transfer fluid, wherein the heat transfer fluid has a low surface tension.

18. A heat transfer system, comprising:
    an evaporator section:
    a connecting section; and
    a condenser section, wherein surfaces of each of the evaporator section, the connecting section, and the condenser section form an enclosed volume, and wherein a superhydrophobic surface is present on at least a portion of the condenser section surface forming a part of the enclosed volume, and wherein the superhydrophobic surface includes a coating of randomly aligned carbon nanotubes.

* * * * *